US012744190B2

(12) United States Patent
Shihommatsu et al.

(10) Patent No.: US 12,744,190 B2
(45) Date of Patent: Sep. 22, 2026

(54) PLASMA PROCESSING APPARATUS AND GAS SUPPLY METHOD

(71) Applicant: Tokyo Electron Limited, Tokyo (JP)

(72) Inventors: Kota Shihommatsu, Miyagi (JP); Takashi Aramaki, Miyagi (JP); Lifu Li, Miyagi (JP)

(73) Assignee: TOKYO ELECTRON LIMITED, Tokyo (JP)

(*) Notice: Subject to any disclaimer, the term of this patent is extended or adjusted under 35 U.S.C. 154(b) by 468 days.

(21) Appl. No.: 18/086,647

(22) Filed: Dec. 22, 2022

(65) Prior Publication Data

US 2023/0207276 A1 Jun. 29, 2023

(30) Foreign Application Priority Data

Dec. 23, 2021 (JP) ................................ 2021-209634

(51) Int. Cl.
*H01J 37/32* (2006.01)

(52) U.S. Cl.
CPC .. *H01J 37/32449* (2013.01); *H01J 37/32091* (2013.01); *H01J 37/32183* (2013.01); *H01J 37/32715* (2013.01); *H01J 2237/334* (2013.01)

(58) Field of Classification Search
CPC ............ H01J 37/32449; H01J 37/3244; C23C 16/45512; C23C 16/45561
See application file for complete search history.

(56) References Cited

U.S. PATENT DOCUMENTS 4,369,031 A * 1/1983 Goldman ................ F27D 19/00 118/724
2003/0003696 A1* 1/2003 Gelatos ............... C23C 16/4405 438/935
2006/0016559 A1* 1/2006 Kobayashi ........ H01J 37/32082 156/345.34
2015/0228457 A1 8/2015 Yamashita et al.
2021/0147982 A1 5/2021 Sung et al.

FOREIGN PATENT DOCUMENTS

JP 2009-117477 A 5/2009
JP 2011-211016 A 10/2011
JP 2014-063918 A 4/2014
JP 2018-121051 A 8/2018
KR 10-20150002496 A 1/2015
KR 10-20190064496 A 6/2019

* cited by examiner

*Primary Examiner* — Parviz Hassanzadeh
*Assistant Examiner* — Nathan K Ford
(74) *Attorney, Agent, or Firm* — XSENSUS LLP

(57) ABSTRACT

There is provided a plasma processing apparatus comprising: a plasma processing chamber having a substrate support configured to support a substrate; a shower head having a plurality of gas inlets configured to introduce a gas into respective regions in the plasma processing chamber; a gas supply configured to supply a gas to the plurality of gas inlets; a plasma generator configured to generate a plasma of the gas; and a controller configured to control at least the gas supply. The gas supply includes: a gas unit configured to supply a common gas to the plurality of gas inlets; and an injection unit configured to supply an injection gas to the selected gas inlet among the plurality of gas inlets, and the controller controls the injection unit so that two or more types of injection gases are supplied to two different ones of the plurality of gas inlets.

5 Claims, 6 Drawing Sheets

| | (a) | (b) | (c) | (d) | (e) | (f) |
|---|---|---|---|---|---|---|
| Main CxHyFz | On | On | On | On | On | On |
| Main O2 | On | On | On | On | On | On |
| Inj. C4F8 | - | C | M | E | C | M |
| Inj. C4F6 | - | C | M | E | E | E |
| ER | | | | | | |
| Normalized | | | | | | |

PLASMA PROCESSING APPARATUS AND GAS SUPPLY METHOD

CROSS-REFERENCE TO RELATED APPLICATION

This application claims priority to Japanese Patent Application No. 2021-209634 filed on Dec. 23, 2021, the entire contents of which are incorporated herein by reference.

TECHNICAL FIELD

The present disclosure relates to a plasma processing apparatus and a gas supply method.

BACKGROUND

Japanese Laid-open Patent Publication No. 2009-117477 discloses a substrate processing apparatus including a shower head having a first gas inlet that introduces a gas into a center region in a chamber, a second gas inlet that introduces a gas into an edge region in the chamber, and a third gas inlet that introduces a gas into a region on the outer side relative to the second gas inlet. Further, Japanese Laid-open Patent Publication No. 2009-117477 discloses that the first gas inlet and the second gas inlet introduce a processing gas into the chamber. Further, Japanese Laid-open Patent Publication No. 2009-117477 discloses that the third gas inlet switches between a processing gas and an additional gas using a switching valve and introduces the processing gas or the additional gas into the chamber.

SUMMARY

In an aspect, the present disclosure provides a plasma processing apparatus and a gas supply method for controlling in-plane uniformity of plasma processing.

The plasma processing apparatus comprises: a plasma processing chamber having a substrate support configured to support a substrate; a shower head having a plurality of gas inlets configured to introduce a gas into respective regions in the plasma processing chamber; a gas supply configured to supply a gas to the plurality of gas inlets; a plasma generator configured to generate a plasma of the gas; and a controller configured to control at least the gas supply, wherein the gas supply includes: a gas unit configured to supply a common gas to the plurality of gas inlets; and an injection unit configured to supply an injection gas to the selected gas inlet among the plurality of gas inlets, and the controller controls the injection unit so that two or more types of injection gases are supplied to two different ones of the plurality of gas inlets.

BRIEF DESCRIPTION OF THE DRAWINGS

FIG. 4 is a diagram illustrating an example of a substrate processing result.

DETAILED DESCRIPTION

Hereinafter, various exemplary embodiments will be described in detail with reference to the drawings. Further, in the respective figures, the same or equivalent portions are denoted by the same reference signs.

Figure 1:
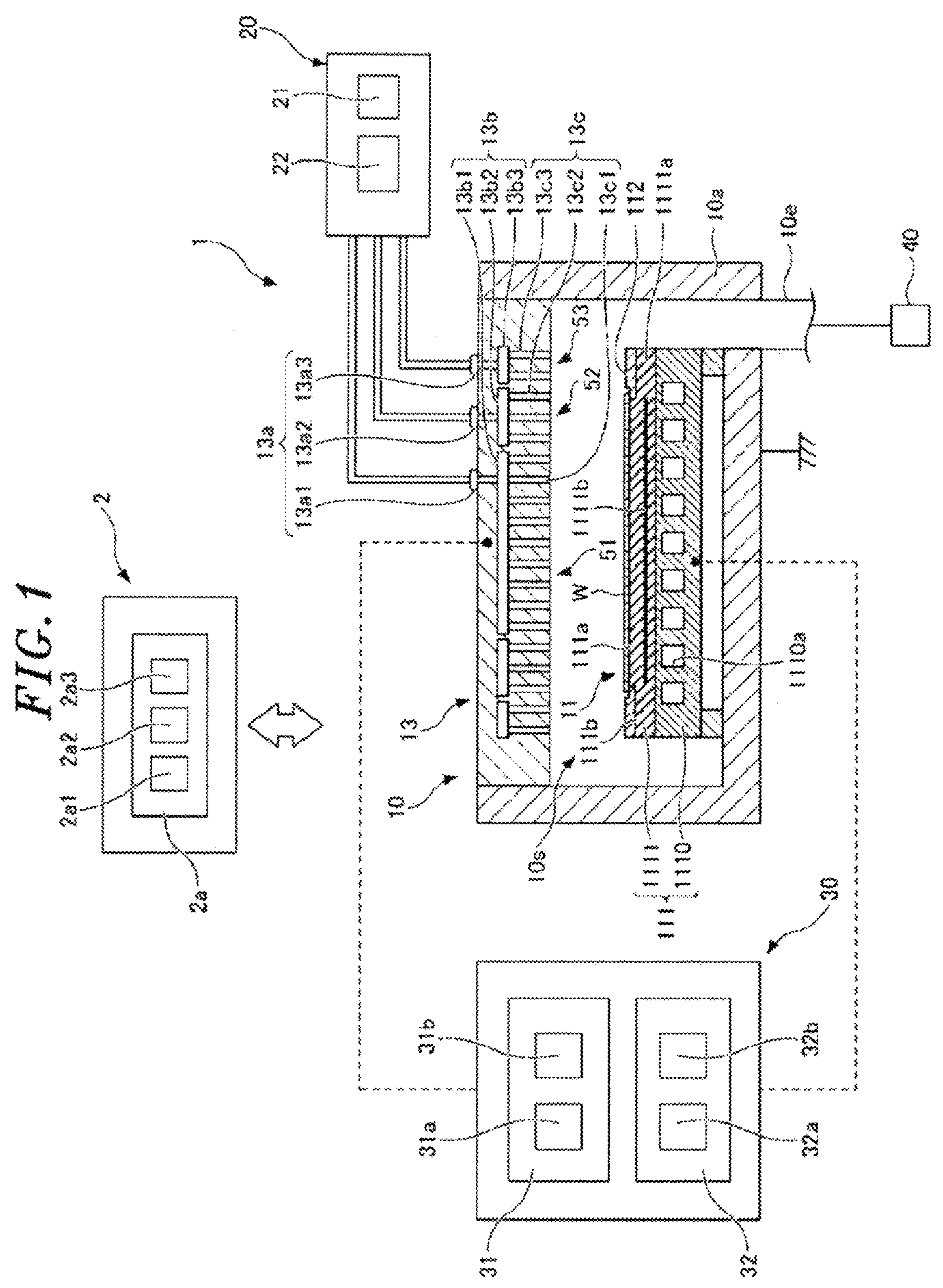
FIG. 1 illustrates an illustrative diagram illustrating a configuration example of a capacitively coupled plasma processing apparatus.

Hereinafter, a configuration example of a plasma processing system will be described. FIG. 1 illustrates an example of a diagram illustrating a configuration example of a capacitively coupled plasma processing apparatus.

The plasma processing system includes a capacitively coupled plasma processing apparatus 1 and a controller 2. The capacitively coupled plasma processing apparatus 1 includes a plasma processing chamber 10, a gas supply 20, a power supply 30, and an exhaust system 40. Further, the plasma processing apparatus 1 includes a substrate support 11 and a gas inlet. The gas inlet is configured to introduce at least one processing gas into the plasma processing chamber 10. The gas inlet includes a shower head 13. The substrate support 11 is disposed in the plasma processing chamber 10. The shower head 13 is disposed above the substrate support 11. In an embodiment, the shower head 13 constitutes at least a portion of a ceiling of the plasma processing chamber 10. The plasma processing chamber 10 includes a plasma processing space 10*s* defined by the shower head 13, a sidewall 10*a* of the plasma processing chamber 10, and the substrate support 11. The plasma processing chamber 10 includes at least one gas supply port for supplying the at least one processing gas to the plasma processing space 10*s*, and at least one gas exhaust port for exhausting a gas from the plasma processing space. The plasma processing chamber 10 is grounded. The shower head 13 and the substrate support 11 are electrically insulated from a housing of the plasma processing chamber 10.

The substrate support 11 includes a body 111 and a ring assembly 112. The body 111 includes a central region 111*a* for supporting a substrate W, and an annular region 111*b* for supporting the ring assembly 112. A wafer is an example of the substrate W. The annular region 111*b* of the body 111 surrounds the central region 111*a* of the body 111 in plan view. The substrate W is disposed on the central region 111*a* of the body 111, and the ring assembly 112 is disposed on the annular region 111*b* of the body 111 to surround the substrate W on the central region 111*a* of the body 111. Accordingly, the central region 111*a* is also called a substrate support surface for supporting the substrate W, and the annular region 111*b* is also called a ring support surface for supporting the ring assembly 112.

In an embodiment, the body 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111*a*, and an electrostatic electrode 1111*b* disposed in the ceramic member 1111*a*. The ceramic member 1111*a* includes the central region 111*a*. In an embodiment, the ceramic member 1111*a* also includes the annular region 111*b*. Further, another member surrounding the electrostatic chuck 1111, such as an annular electrostatic chuck or an annular insulating member, may include the annular region 111*b*. In this case, the ring assembly 112 may be disposed on the annular electrostatic chuck or the annular insulating member, or may be disposed on both the electrostatic chuck 1111 and the annular insulating member. Further, at least one RF/DC electrode connected to a radio frequency (RF) power supply 31 and/or a direct current (DC) power supply 32 to be described below may be disposed in the ceramic member 1111*a*. In this case, the at least one RF/DC electrode functions as the lower electrode. When a bias RF signal and/or DC signal to be described below is supplied to the at least one RF/DC electrode, the RF/DC electrode is also called a bias electrode. Further, the conductive member of the base 1110 and the at least one RF/DC electrode may function as a plurality of lower electrodes. Further, the electrostatic electrode 1111*b* may function as the lower electrode. Accordingly, the substrate support 11 includes at least one lower electrode.

The ring assembly 112 includes one or a plurality of annular members. In an embodiment, the one or plurality annular members includes one or a plurality of edge rings and at least one cover ring. The edge ring is formed of a conductive material or an insulating material, and the cover ring is formed of an insulating material.

Further, the substrate support 11 may include a temperature control module configured to adjust at least one of the electrostatic chuck 1111, the ring assembly 112, and the substrate to a target temperature. The temperature control module may include a heater, a heat transfer medium, flow paths 1110*a*, or a combination thereof. A heat transfer fluid such as a brine or a gas flows through the flow paths 1110*a*. In an embodiment, the flow paths 1110*a* are formed in the base 1110, and one or a plurality of heaters are disposed in the ceramic member 1111*a* of the electrostatic chuck 1111. Further, the substrate support 11 may also include a heat transfer gas supply configured to supply a heat transfer gas to a gap between a back surface of the substrate W and the central region 111*a*.

The shower head 13 is configured to introduce the at least one processing gas from the gas supply 20 into the plasma processing space 10*s*. The shower head 13 includes at least one gas supply port 13*a* (13*a*1 to 13*a*3), at least one gas diffusion chamber 13*b* (13*b*1 to 13*b*3), and a plurality of gas inlets 13*c* (13*c*1 to 13*c*3). A processing gas supplied to the gas supply port 13*a* passes through the gas diffusion chamber 13*b* and is introduced into the plasma processing space 10*s* from the plurality of gas introduction ports 13*c*.

Further, the shower head 13 illustrated in FIG. 1 includes a gas inlet 51, a gas inlet 52, and a gas inlet 53. The gas inlet 51 introduces a gas into a central region (a center region) of the substrate W in the plasma processing chamber 10. The gas inlet 52 introduces a gas into an outer region (an intermediate region) relative to the gas inlet 51. The gas inlet 53 introduces a gas into an outer region (an edge region) relative to the gas inlet 52. The gas inlet 51, the gas inlet 52, and the gas inlet 53 are disposed concentrically.

The gas diffusion chamber 13*b* includes a gas diffusion chamber 13*b*1, a gas diffusion chamber 13*b*2, and a gas diffusion chamber 13*b*3.

The gas supply port 13*a*1 and a plurality of gas introduction ports 13*c*1 are connected to the gas diffusion chamber 13*b*1 so that a gas can flow therethrough. The gas inlet 51 includes the gas supply port 13*a*1, the gas diffusion chamber 13*b*1, and the plurality of gas introduction ports 13*c*1. Further, the gas supply port 13*a*2 and a plurality of gas introduction ports 13*c*2 are connected to the gas diffusion chamber 13*b*2 so that a gas can flow therethrough. The gas inlet 52 includes the gas supply port 13*a*2, the gas diffusion chamber 13*b*2, and the plurality of gas introduction ports 13*c*2. Further, the gas supply port 13*a*3 and a plurality of gas introduction ports 13*c*3 are connected to the gas diffusion chamber 13*b*3 so that a gas can flow therethrough. The gas inlet 53 includes the gas supply port 13*a*3, the gas diffusion chamber 13*b*3, and the plurality of gas introduction ports 13*c*3.

Further, the shower head 13 includes at least one upper electrode. Further, the gas inlet may include one or a plurality of side gas injectors (SGIs) mounted to one or a plurality of openings formed in the side wall 10*a*, in addition to the shower head 13.

The gas supply 20 may include at least one gas source 21 and at least one flow rate controller 22. In an embodiment, the gas supply 20 is configured to supply the at least one processing gas from each corresponding gas source 21 to the shower head 13 via each corresponding flow rate controller 22. Each flow rate controller 22 may include, for example, a mass flow rate controller or a pressure-controlled flow rate controller. Further, the gas supply 20 may include one or more flow rate modulation devices that modulate or pulse a flow rate of the at least one processing gas.

The power supply 30 includes an RF power supply 31 coupled to the plasma processing chamber 10 via at least one impedance matching circuit. The RF power supply 31 is configured to supply at least one RF signal (RF power) to the at least one lower electrode and/or the at least one upper electrode. Accordingly, plasma is formed from the at least one processing gas supplied to the plasma processing space 10*s*. This makes it possible for the RF power supply 31 to function as at least a portion of a plasma generator configured to generate a plasma from one or more processing gases in the plasma processing chamber 10. Further, when the bias RF signal is supplied to the at least one lower electrode, a bias potential is generated in the substrate W, and ion components in the formed plasma can be drawn into the substrate W.

In an embodiment, the RF power supply 31 includes a first RF generator 31*a* and a second RF generator 31*b*. The first RF generator 31*a* is configured to be connected to the at least one lower electrode and/or the at least one upper electrode via at least one impedance matching circuit and generate a source RF signal (source RF power) for plasma generation. In an embodiment, the source RF signal has a frequency in a range of 10 MHz to 150 MHz. In an embodiment, the first RF generator 31*a* may be configured to generate a plurality of source RF signals having different frequencies. The one or plurality of generated source RF signals are supplied to the at least one lower electrode and/or the at least one upper electrode.

The second RF generator 31*b* is configured to be connected to the at least one lower electrode via at least one impedance matching circuit and generate a bias RF signal (bias RF power). A frequency of the bias RF signal may be the same as or different from the frequency of the source RF signal. In an embodiment, the bias RF signal has a lower frequency than the source RF signal. In an embodiment, the bias RF signal has a frequency in a range from 100 kHz to 60 MHz. In an embodiment, the second RF generator 31*b* may be configured to generate a plurality of bias RF signals having different frequencies. The one or a plurality of generated bias RF signals are supplied to the at least one lower electrode. Further, in various embodiments, at least one of the source RF signal and the bias RF signal may be pulsed.

The power supply 30 may also include a DC power supply 32 coupled to the plasma processing chamber 10. The DC power supply 32 includes a first DC generator 32*a* and a second DC generator 32*b*. In an embodiment, the first DC generator 32*a* is connected to the at least one lower electrode and is configured to generate a first DC signal. The generated first bias DC signal is applied to the at least one lower electrode. In an embodiment, the second DC generator **32*b*** is connected to the at least one upper electrode and is configured to generate a second DC signal. The generated second DC signal is applied to the at least one upper electrode.

In various embodiments, at least one of the first and second DC signals may be pulsed. In this case, a sequence of voltage pulses is applied to the at least one lower electrode and/or to the at least one upper electrode. The voltage pulse may have a rectangular pulse waveform, a trapezoidal pulse waveform, a triangular pulse waveform, or a combination thereof. In an embodiment, a waveform generator for generating the sequence of voltage pulses from a DC signal is connected between the first DC generator **32*a* and at least one lower electrode. Accordingly, the first DC generator 32*a* and the waveform generator constitute a voltage pulse generator. When the second DC generator 32*b* and the waveform generator constitute the voltage pulse generator, the voltage pulse generator is connected to the at least one upper electrode. The voltage pulse may have a positive polarity or may have a negative polarity. Further, the sequence of voltage pulses may include one or a plurality of positive voltage pulses and one or a plurality of negative voltage pulses in one period. Further, the first and second DC generators 32*a* and 32*b* may be additionally installed in the RF power supply 31, and the first DC generator 32*a* may be installed instead of the second RF generator 31*b***.

The exhaust system 40 may be connected to, for example, a gas outlet **10*e* installed at a bottom of the plasma processing chamber 10. The exhaust system 40 may include a pressure adjustment valve and a vacuum pump. Pressure in the plasma processing space 10*s*** is adjusted by the pressure adjustment valve. The vacuum pump may include a turbo molecular pump, a dry pump, or a combination thereof.

The controller 2 processes computer-executable instructions for causing the plasma processing apparatus 1 to execute various processes described in the present disclosure. The controller 2 may be configured to control respective elements of the plasma processing apparatus 1 so that the plasma processing apparatus 1 executes various processes described herein. In an embodiment, a part or all of the controller 2 may be included in the plasma processing apparatus 1. The controller 2 may include a processor **2*a*1, a storage 2*a*2, and a communication interface 2*a*3. The controller 2 is realized by, for example, a computer 2*a*. The processor 2*a*1 may be configured to read a program from the storage 2*a*2 and execute the read program to perform various control operations. This program may be stored in the storage 2*a*2 in advance, or may be acquired via a medium when necessary. The acquired program is stored in the storage 2*a*2, read from the storage 2*a*2 by the processor 2*a*1, and executed by the processor 2*a*1. The medium may be various storage media readable by the computer 2*a*, or may be a communication line connected to the communication interface 2*a*3. The processor 2*a*1 may be a central processing unit (CPU). The storage 2*a*2 may include a random access memory (RAM), a read only memory (ROM), a hard disk drive (HDD), a solid state drive (SSD), or a combination thereof. The communication interface 2*a*3 may communicate with the plasma processing apparatus 1** via a communication line such as a local area network (LAN).

Figure 2:
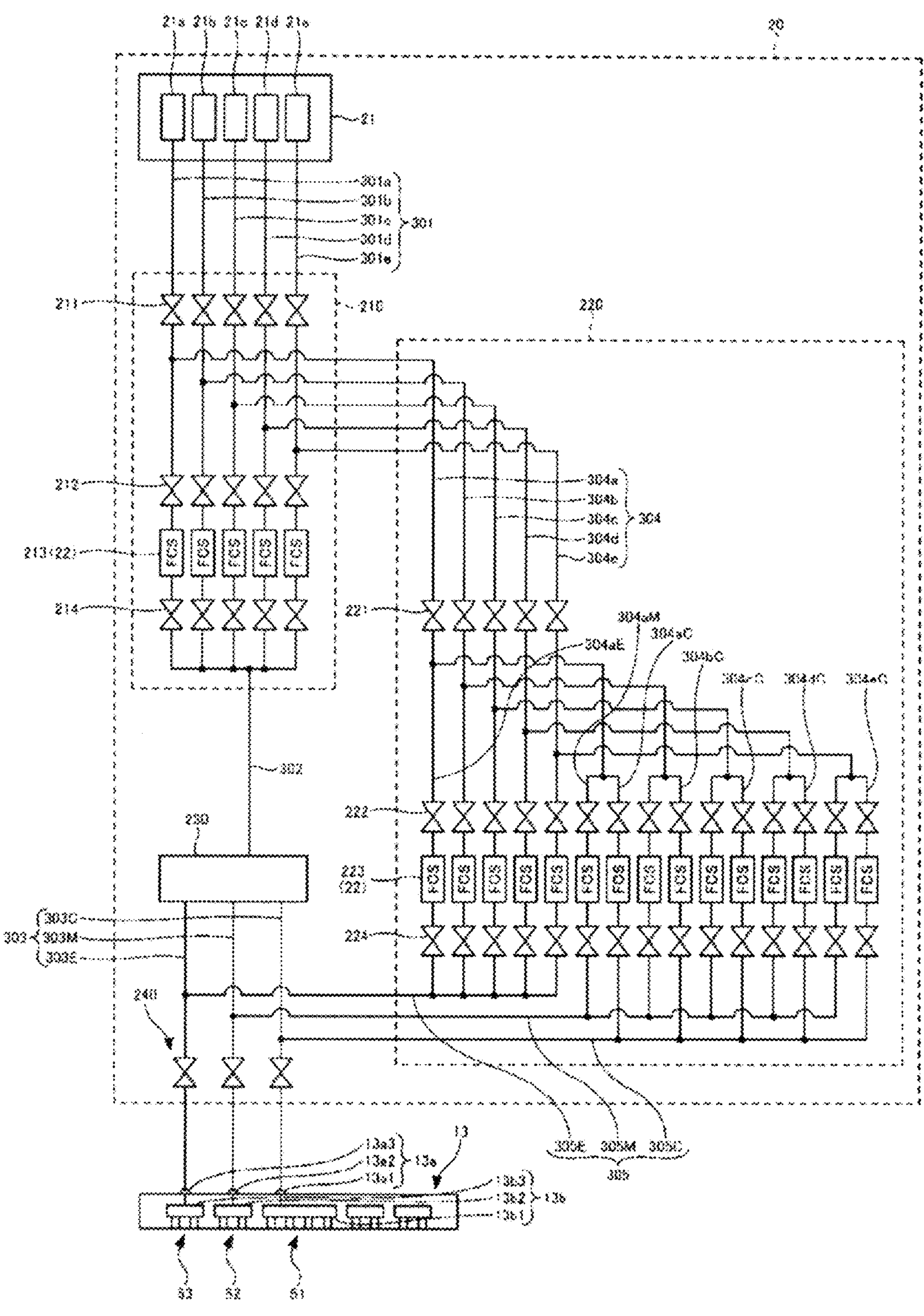
FIG. 2 illustrates an example of a configuration diagram of a gas supply.

Next, the gas supply 20 will be described with reference to FIG. 2. FIG. 2 illustrates an example of a configuration diagram of the gas supply 20.

The gas supply 20 includes the gas source 21, a gas unit 210 including a flow rate controller 22 (213 and 223), an injection unit 220, a flow splitter 230, and a valve 240.

The gas source 21 includes a plurality of gas sources **21*a* to 21*e*. In the following description, the plasma processing apparatus 1 is a plasma etching apparatus that etches an $SiO_2$ film formed on the substrate W, the gas source 21*a* supplies an $O_2$ gas, the gas source 21*b* supplies an $NF_3$ gas, the gas source 21*c* supplies a $CH_2F_2$ gas, the gas source 21*d* supplies a $C_4F_8$ gas, and the gas source 21*e*** supplies a $C_4F_6$ gas.

The gas unit 210 is supplied with each gas from the gas source 21 (**21*a* to 21*e*), selects a gas to be supplied to the flow splitter 230**, and adjusts a flow rate of the selected gas.

Specifically, the gas unit 210 includes a valve 211, a valve 212, a flow rate controller 213, a valve 214, a gas flow path 301 (**301*a* to 301*e*), and a gas flow path (302**).

The gas flow path 301 (**301*a* to 301*e*) are installed for each gas type of the gas source 21. In the example illustrated in FIG. 2, five systems of the gas flow path 301 (301*a* to 301*e*) are installed to correspond to the gas types of the gas source 21. The upstream sides of the respective gas flow paths 301 (301*a* to 301*e*) are connected to the respective gas sources 21 (21*a* to 21*e*). The valve 211, the valve 212, the flow rate controller 213 (22), and the valve 214 are installed in the gas flow paths 301 (301*a* to 301*e*) in order from the gas source 21 side. The downstream sides of the gas flow paths 301 (301*a* to 301*e*) merge and connect to the gas flow path 302. Further, the downstream side of the gas flow path 302 is connected to the flow splitter 230**.

The valve 211 is an opening and closing valve for opening or closing the gas flow path 301. The valves 212 and 214 are opening and closing valves that are used when a gas to be supplied to the flow splitter 230 is selected. The valve 212 is installed on the upstream side of the flow rate controller 213, and the valve 214 is installed on the downstream side of the flow rate controller 213. For the flow rate controller 213, for example, a mass flow rate controller or a pressure-controlled flow rate controller may be used.

With this configuration, the controller 2 may control the opening and closing of the valve 212 and the valve 214 to select the gas to be supplied to the flow splitter 230. Further, the controller 2 may control the flow rate controller 213 to adjust a flow rate of the selected gas. The gas which is selected by the gas unit 210 and whose flow rate has been adjusted by the gas unit 210 (a mixed gas when a plurality of gases are selected) is supplied to the flow splitter 230. Further, in the following description, the gas supplied from the gas unit 210 to the flow splitter 230 is also called a common gas (or a main gas).

The flow splitter 230 distributes and supplies the common gas supplied from the gas unit 210 (the gas flow path 302) to gas flow paths 303 (303C, 303M, and 303E).

The gas flow paths 303 (303C, 303M, and 303E) are installed for the respective divided gas inlets of the shower head 13. In the example illustrated in FIG. 2, the shower head 13 includes the gas inlet divided into three portions (the gas inlet 51, the gas inlet 52, and the gas inlet 53), and three systems of gas flow paths 303 (303C, 303M, and 303E)) are installed to correspond to the number of gas inlets. The valve 240 is installed in the gas flow paths 303 (303C, 303M, and 303E). The valve 240 is an opening and closing valve for opening or closing the gas flow path 303. Further, the downstream side of the gas flow path 302 is connected to the gas supply port **13*a* of the shower head 13**.

That is, the downstream side of the gas flow path 303C is connected to the gas supply port **13*a*1. The downstream side of the gas flow path 303**M is connected to the gas supply port 13*a*2. The downstream side of the gas flow path 303E is connected to the gas supply port 13*a*3.

With this configuration, the common gas distributed from the flow splitter 230 is supplied to the gas supply ports 13*a*1 to 13*a*3 of the shower head 13 via the gas flow path 303.

Accordingly, the common gas whose flow rate has been adjusted, which is selected in the gas unit 210, is introduced into the center region, the intermediate region, and the edge region in the plasma processing chamber 10 from the gas inlet 51, the gas inlet 52, and the gas inlet 53.

The injection unit 220 is supplied with the respective gases from the gas source 21 (21*a* to 21*e*), independently selects the gases (injection gases) supplied to the gas flow path 303C (the gas supply port 13*a*1), the gas flow path 303M (the gas supply port 13*a*2), and the gas flow path 303E (the gas supply port 13*a*3), and adjusts a flow rate of the selected gas.

Specifically, the injection unit 220 includes a valve 221, a valve 222, a flow rate controller 223, a valve 224, a gas flow path 304 (304*a* to 304*e*), and a gas flow path (305 (305C, 305M, 305E)).

The gas flow path 304 (304*a* to 304*e*) is installed for each gas type of the gas source 21. In the example illustrated in FIG. 2, five systems of gas flow path 304 (304*a* to 304*e*) are installed to correspond to the gas types of the gas source 21. An upstream side of the gas flow path 304 (304*a* to 304*e*) is connected to the gas flow path 301 (301*a* to 301*e*) between the valve 211 and the valve 212. The valve 221 is installed in the gas flow path 304 (304*a* to 304*e*).

Further, the gas flow path 304 (304*a* to 304*e*) is branched into three to correspond to the number of gas flow paths 303 (303C, 303M, and 303E) (in other words, the number of divided gas inlets) on the downstream side of the valve 221. The gas flow path 304*a* is branched into a gas flow path 304*a*C, a gas flow path 304*a*M, and a gas flow path 304*a*E. The valve 222, the flow rate controller 223 (22), and the valve 224 are installed in the branched gas flow paths 304*a*C, 304*a*M, and 304*a*E in order from the valve 221 side.

Similarly, each of the gas flow paths 304*b* to 304*e* is branched into three on the downstream side of the valve 221, and in each of the branched gas flow paths, the valve 222, the flow rate controller 223 (22), and the valve 224 are installed in order from the valve 221 side.

A downstream side of the gas flow path 304*a*C merges with a gas flow path 304*b*C branched from the gas flow path 304*b*, a gas flow path 304*c*C branched from the gas flow path 304*c*, a gas flow path 304*d*C branched from the gas flow path 304*d*, and a gas flow path 304*e*C branched from the gas flow path 304*e*, and connects to the gas flow path 305C. A downstream side of the gas flow path 305C is connected to the gas flow path 303C between the flow splitter 230 and the valve 240.

Similarly, a downstream side of the gas flow path 304*a*M merges with a gas flow path branched from the gas flow path 304*b*, a gas flow path branched from the gas flow path 304*c*, a gas flow path branched from the gas flow path 304*d*, and a gas flow path branched from the gas flow path 304*e*, and connects to the gas flow path 305M. A downstream side of the gas flow path 305M is connected to the gas flow path 303M between the flow splitter 230 and the valve 240. Further, a downstream side of the gas flow path 304*a*E merges with a gas flow path branched from the gas flow path 304*b*, a gas flow path branched from the gas flow path 304*c*, a gas flow path branched from the gas flow path 304*d*, and a gas flow path branched from the gas flow path 304*e*, and connects to the gas flow path 305E. A downstream side of the gas flow path 305E is connected to the gas flow path 303E between the flow splitter 230 and the valve 240.

The valve 221 is an opening and closing valve for opening or closing the gas flow path 304. The valves 222 and 224 are opening and closing valves that are used when the gases (injection gases) supplied to the gas flow path 303C (the gas supply port 13*a*1), the gas flow path 303M (the gas supply port 13*a*2), and the gas flow path 303E (the gas supply port 13*a*3) are independently selected, the valve 222 is installed on the upstream side of the flow rate controller 223, and the valve 224 is installed on the downstream side of the flow rate controller 223. For the flow rate controller 223, for example, a mass flow rate controller or a pressure-controlled flow rate controller may be used. Further, the flow rate controllers 223 are installed to correspond to the number (15 in FIG. 2) obtained by multiplying the number (five in FIG. 2) of the types of gases supplied to the injection unit 220 by the number of gas flow paths 303 (in other words, the number of divided gas inlets, which is three in FIG. 2).

With such a configuration, the controller 2 may control the opening and closing of the valve 222 and the valve 224 to independently select the gases (injection gases) supplied to the gas flow path 303C (the gas supply port 13*a*1), the gas flow path 303M (the gas supply port 13*a*2), and the gas flow path 303E (the gas supply port 13*a*3). Further, the controller 2 may control the flow rate controller 223 to adjust a flow rate of the selected gas. Further, a gas (a mixed gas when a plurality of gases are selected) which has been selected for each of the gas inlets 51 to 53 and whose flow rate has been adjusted in the injection unit 220 is supplied to the gas flow paths 303C, 303M, and 303E corresponding to the respective gas inlets 51 to 53. That is, a gas can be individually injected into the gas flowing through the gas flow paths 303C, 303M, and 303E. Further, in the following description, the gas injected into the common gas flowing through the gas flow paths 303 (303C, 303M, and 303E) from the injection unit 220 is also referred to as an injection gas.

Further, a case in which the number of types of gas supplied by the gas source 21 is five (the gas sources 21*a* to 21*e*) in the gas supply 20 illustrated in FIG. 2 has been described, the present disclosure is not limited thereto, and the number may be two or more. For example, when the $SiO_2$ film is etched, some of gases $CF_4$, $C_4F_6$, $C_4F_8$, $C_3F_8$, $CH_2F_2$, $CHF_3$, $NF_3$, HBr, $Cl_2$, $N_2$, $O_2$, CO, $CO_2$, Ar, and Kr can be used as gases that are supplied by the gas source 21.

Further, a case in which the gas inlet of the shower head 13 illustrated in FIGS. 1 and 2 is divided into three gas inlets (the gas inlets 51 to 53) has been described, but the present disclosure is not limited thereto, and the gas inlet may be divided into two or more gas inlets. Further, a case in which the number (five in FIG. 2) of systems of the gas flow path 301 (301*a* to 301*e*) in the gas unit 210 is equal to the number (five in FIG. 2) of systems of the gas flow path 304 (304*a* to 304*e*) in the injection unit 220 has been described, but the present disclosure is not limited thereto and the numbers may be different. That is, some of the types of gases supplied to the gas unit 210 by the gas source 21 may be supplied to the injection unit 220. That is, in the injection unit 220, the gas flow path 304 corresponding to the type of gas that is used only as the common gas may not be installed. This makes it possible to reduce the number of parts of the flow rate controller 223 and the like.

Figure 3:
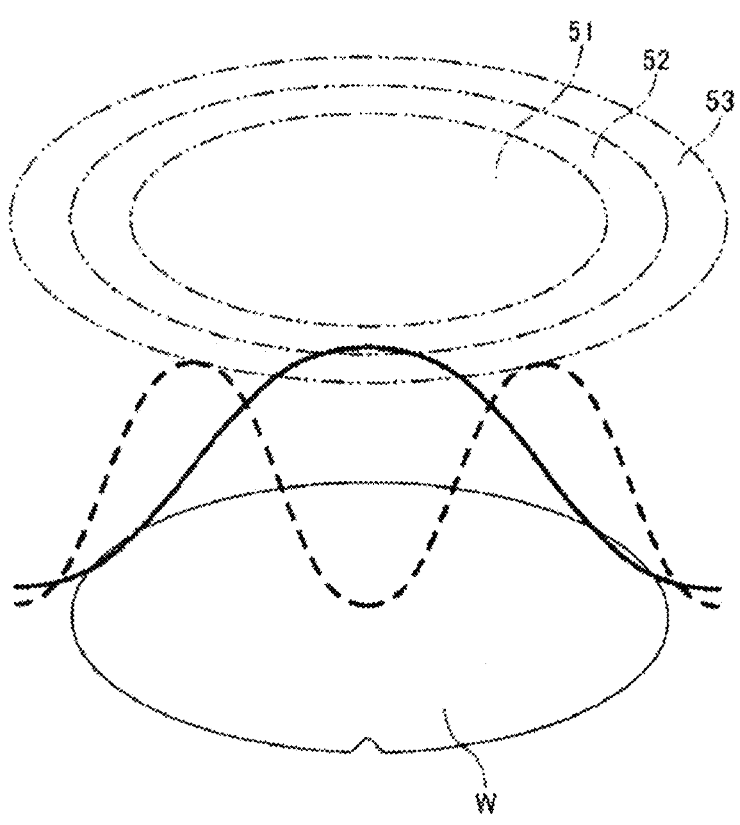
FIG. 3 is a diagram illustrating an example of a result of substrate processing using a plasma processing apparatus having a gas supply.

FIG. 3 is a schematic diagram illustrating in-plane uniformity control of substrate processing using the plasma processing apparatus 1 including the gas supply 20. In FIG. 3, the substrate W supported by the substrate support 11 is illustrated, and positions of the gas inlets 51 to 53 of the shower head 13 disposed to face the substrate W are indicated by double-dotted lines.

The controller 2 controls the injection unit 220, for example, so that a first injection gas is introduced into the plasma processing space 10*s* from the gas inlet 51, and a second injection gas is introduced into the plasma processing space 10*s* from the gas inlet 52. Further, in the example illustrated in FIG. 3, an injection gas is not introduced from the gas inlet 53. Further, in this control, a common gas is introduced into the plasma processing space 10*s* from the gas inlets 51 to 53 by controlling the gas unit 210. An example of a distribution of the first injection gas on a front surface of the substrate W is indicated by a solid line. Further, an example of a distribution of the second injection gas on the front surface of the substrate W is indicated by a dashed line.

Thus, the gas supply 20 can inject any amount of gas into any place (the gas inlets 51 to 53). This makes it possible to expand controllability of in-plane uniformity in substrate processing and widen a process window.

Figure 4:
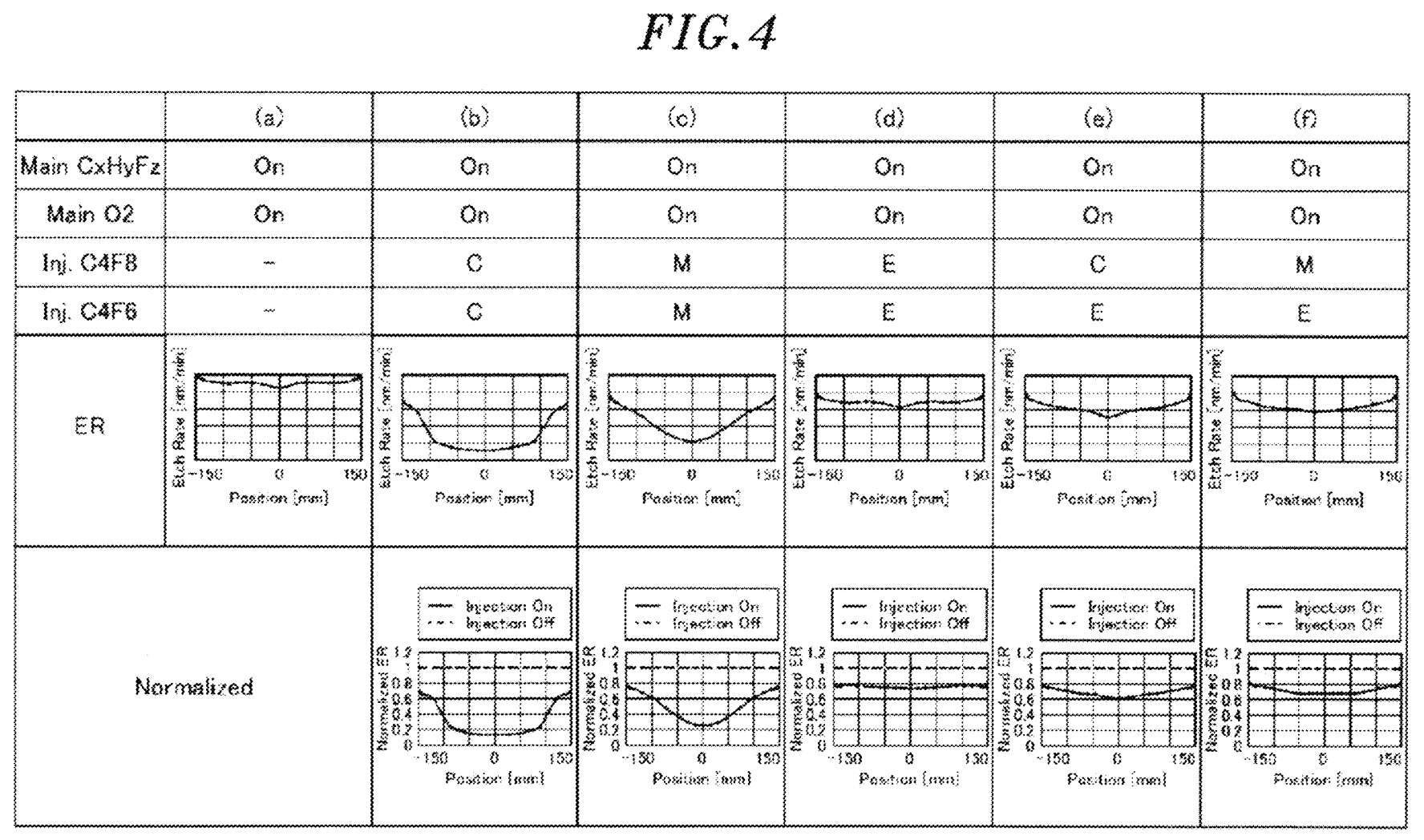

Next, an example of a result of substrate processing using the plasma processing apparatus 1 including the gas supply 20 will be described with reference to FIGS. 4 and 5. FIG. 4 is a diagram illustrating the example of the result of substrate processing using the plasma processing apparatus 1 including the gas supply 20. Here, the gas source 21 supplied an O2 gas, a $CH_2F_2$ gas, a $C_4F_8$ gas, and a $C_4F_6$ gas, and the plasma processing apparatus 1 performed plasma etching processing on the $SiO_2$ film formed on the substrate W.

In a row indicated by "Main CxHyFz", "On" indicates that the $CH_2F_2$ gas is supplied to the gas inlets 51 to 53 from the gas unit 210 through the flow splitter 230. In a row indicated by Main O2, "On" indicates that the $O_2$ gas is supplied to the gas inlets 51 to 53 from the gas unit 210 through the flow splitter 230. That is, (a) to (f) in FIG. 4 show that the $CH_2F_2$ gas and the $O_2$ gas are supplied as common gases.

A row indicated by "Inj. C4F8" shows that the $C_4F_8$ gas is supplied to a selected gas inlet among the gas inlets 51 to 53 from the injection unit 220. A row indicated by "Inj. C4F6" shows that the $C_4F_6$ gas is supplied to a selected gas inlet among the gas inlets 51 to 53 from the injection unit 220. Further, "C" indicates that the injection gas is injected into the gas inlet 51 (the gas flow path 303C). "M" indicates that the injection gas is injected into the gas inlet 52 (the gas flow path 303M). "E" indicates that the injection gas is injected into the gas inlet 53 (the gas flow path 303E). That is, (b) to (f) in FIG. 4 show that the $C_4F_8$ gas and the $C_4F_6$ gas are supplied as injection gases. Further, (a) in FIG. 4 shows that only the common gas is supplied without the injection gas being used.

Specifically, in (b), $C_4F_8$ gas and $C_4F_6$ gas were supplied as injection gases to the gas inlet 51 (the gas flow path 303C). In (c), the $C_4F_8$ gas and $C_4F_6$ gas were supplied as injection gases to the gas inlet 52 (the gas flow path 303M). In (d), the $C_4F_8$ gas and $C_4F_6$ gas were supplied as injection gases to the gas inlet 53 (the gas flow path 303E). In (e), the $C_4F_8$ gas was supplied as the injection gas to the gas inlet 51 (the gas flow path 303C), and the $C_4F_6$ gas was supplied as the injection gas to the gas inlet 53 (the gas flow path 303E). In (f), the $C_4F_8$ gas was supplied as the injection gas to the gas inlet 52 (the gas flow path 303M), and the $C_4F_6$ gas was supplied as the injection gas to the gas inlet 53 (the gas flow path 303E).

Further, in FIG. 4, upper ones of graphs at two upper and lower stages show an etch rate. Further, in this graph, a horizontal axis represents a position [mm] in a radial direction of the substrate W, and 0 [mm] represents a center of the substrate W. A vertical axis represents the etch rate. Here, it is shown that the etch rate is higher in an upward direction.

In FIG. 4, the lower graphs of the graphs at the two upper and lower stages show, using a solid line, an etch rate normalized by setting the etch rate in (a), in which the injection gas is not used, to 1. Further, a result of normalized (a) is indicated by a dashed line. That is, the lower graphs show changes in the etch rate due to use of the injection gas with respect to a case in which the injection gas is not used. Further, in this graph, a horizontal axis represents a position in a radial direction of the substrate W, and 0 [mm] represents a center of the substrate W. A vertical axis represents the etch rate. Here, it is shown that the etch rate is higher in an upward direction.

Figure 5:
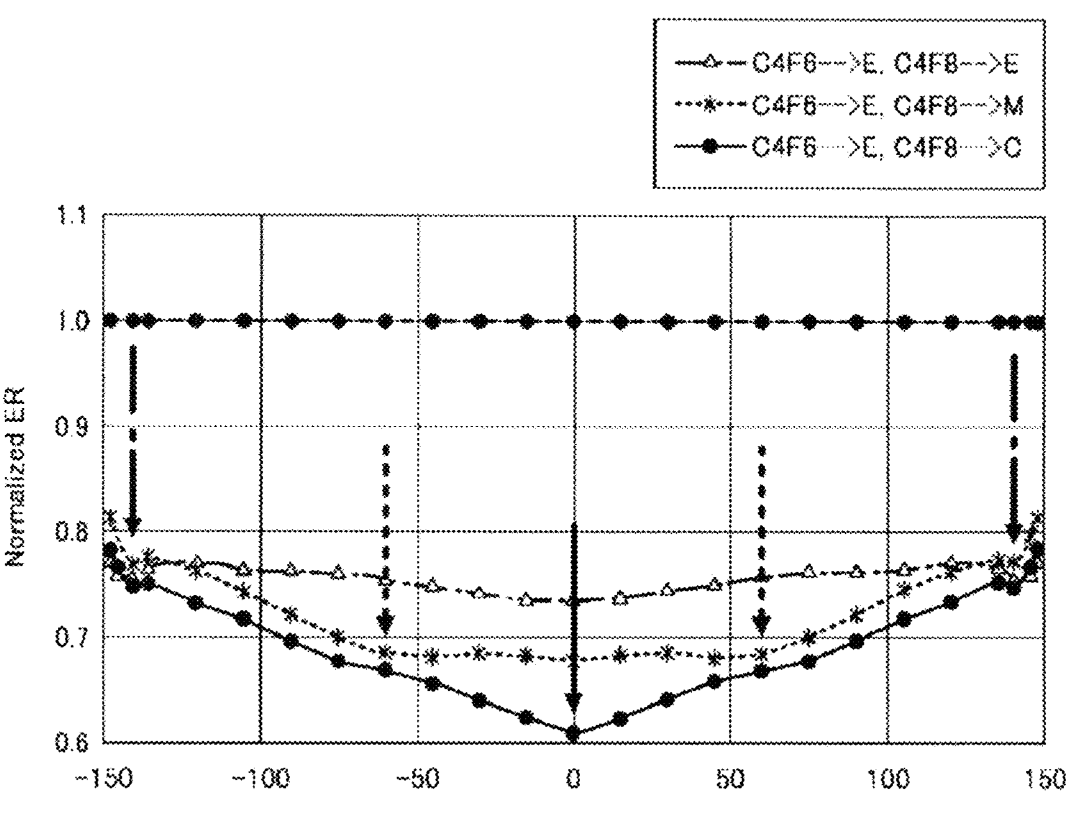
FIG. 5 illustrates an example of a graph of a normalized etch rate.

FIG. 5 illustrates an example of a graph obtained superimposing a graph (a lower graph) of the etch rate normalized by setting the etch rate in (a) of FIG. 4, in which the injection gas is not used, to 1, on one graph, and enlarging a vertical axis. (d) in FIG. 4 is indicated by a dashed-dotted line, (e) in FIG. 4 is indicated by a solid line, and (f) in FIG. 4 is indicated by a dashed line.

The plasma processing apparatus 1 including the gas supply 20 can supply two types of injection gases (a $C_4F_8$ gas and a C4F6 gas) to the same gas inlet, as illustrated in (b) to (d) in FIG. 4. Further, the plasma processing apparatus 1 including the gas supply 20 may supply the two types of injection gases (the $C_4F_8$ gas and the C4F6 gas) to different gas inlets, as illustrated in (e) to (f) in FIG. 4. In other words, the type and flow rate of the injection gas supplied to the gas inlet can be made different for each gas inlet.

Further, as illustrated in (d) to (f) of FIG. 4 and FIG. 5, a position at which the normalized etch rate decreases is changed when the gas inlet to which the $C_4F_8$ gas is supplied is changed. When the $C_4F_8$ gas is supplied to the gas inlet 51 (the gas flow path 303C), the normalized etch rate decreases in a center region of the substrate W (see a solid arrow in FIG. 5). When the $C_4F_8$ gas is supplied to the gas inlet 52 (the gas flow path 303M), the normalized etch rate decreases in an intermediate region of the substrate W (see a dashed arrow in FIG. 5). When the $C_4F_8$ gas is supplied to the gas inlet 53 (the gas flow path 303E), the normalized etch rate decreases in an edge region of the substrate W (see a dashed-dotted arrow in FIG. 5).

Thus, in the plasma processing apparatus 1 including the gas supply 20, it is possible to switch between positions of the gas inlets to which the $C_4F_8$ gas is supplied. As illustrated in FIG. 5, change is performed from a state in which the $C_4F_8$ gas is supplied to the gas inlet 53 (the gas flow path 303E) (see (d) in FIG. 4) to a state in which the $C_4F_8$ gas is supplied to the gas inlet 51 (the gas flow path 303C) (see (e) in FIG. 4) or a state in which the $C_4F_8$ gas is supplied to the gas inlet 52 (the gas flow path 303M) (see (f) in FIG. 4). This makes it possible to finely adjust in-plane uniformity or controllability of the etch rate.

In plasma etching processing illustrated in FIGS. 4 and 5, the $CH_2F_2$ gas supplied as the common gas is used for etching, and the $C_4F_8$ gas used as an example of the injection gas serves to reduce the etch rate. Therefore, the $C_4F_8$ gas can reduce bowing of a concave portion, such as a hole, when a pattern of the concave portion is formed in the substrate W.

Figure 6:
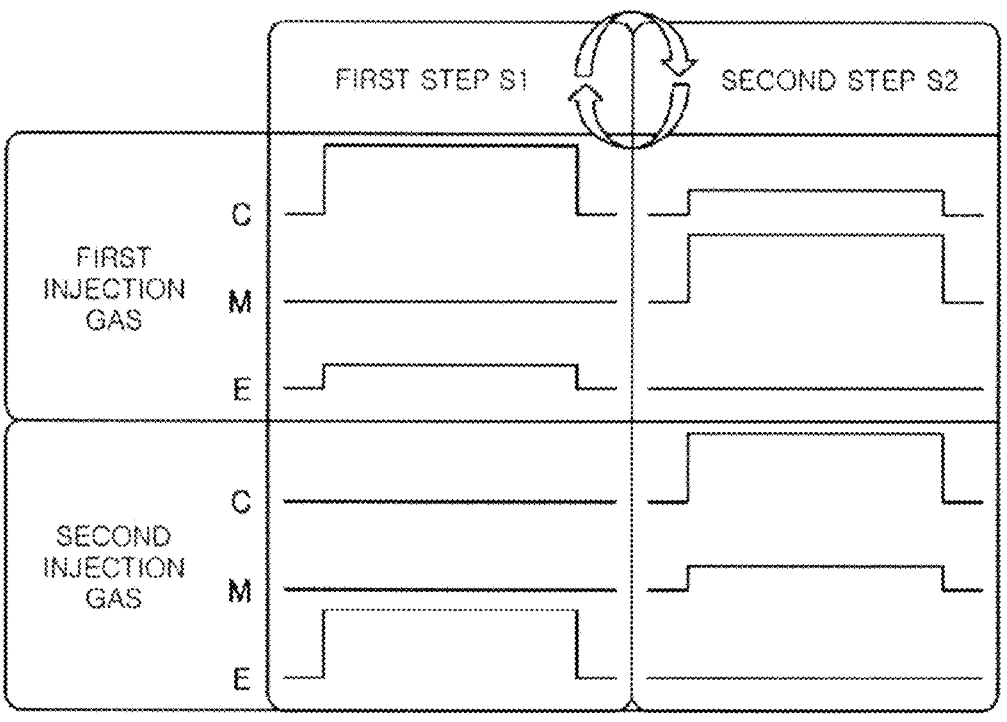
FIG. 6 illustrates an example of a schematic diagram of a time chart illustrating an etching process.

Next, an etching process in which two or more steps are performed in multiple cycles in the plasma etching processing will be described. FIG. 6 illustrates an example of a schematic diagram of a time chart illustrating the etching process.

In the etching process illustrated in FIG. 6, a first step S1 (for example, a protective film deposition step) and a second step S2 (for example, an etching step) are repeated in several cycles.

In the first step S1, for example, the first injection gas is supplied to the gas inlet 51 (the gas flow path 303C) and the gas inlet 53 (the gas flow path 303E), and the second injection gas is supplied to the gas inlet 53 (the gas flow path 303E). Further, a flow rate of the first injection gas supplied to the gas inlet 53 (the gas flow path 303E) is smaller than a flow rate of the first injection gas supplied to the gas inlet 51 (the gas flow path 303C).

In the second step S2, for example, the first injection gas is supplied to the gas inlet 51 (the gas flow path 303C) and the gas inlet 52 (the gas flow path 303M), and the second injection gas is supplied to the gas inlet 51 (the gas flow path 303C) and the gas inlet 52 (the gas flow path 303M). Further, a flow rate of the first injection gas supplied to gas inlet 51 (the gas flow path 303C) is smaller than a flow rate of the first injection gas supplied to the gas inlet 52 (the gas flow path 303M). Further, a flow rate of the second injection gas supplied to the gas inlet 52 (the gas flow path 303M) is smaller than a flow rate of the second injection gas supplied to the gas inlet 51 (the gas flow path 303C).

Thus, in the plasma processing apparatus 1 including the gas supply 20, it is possible to switch, for each step, between the gas types and flow rates of the injection gas supplied to the respective gas inlets 51 to 53 from the injection unit 220 and perform control.

Further, the injection unit 220 supplies the injection gas to the gas flow path 303 (303C, 303M, and 303E) closer to the shower head 13, which is on the downstream side of the flow splitter 230 of the common gas. This makes it possible to improve responsiveness of switching of the gas supplied to the plasma processing space 10*s* from the gas inlets 51 to 53.

For example, a step of supplying the $C_4F_8$ gas illustrated in (d) of FIG. 4 to the gas inlet 53 (the gas flow path 303E), and a step of supplying the $C_4F_8$ gas illustrated in (e) of FIG. 4 to the gas inlet 51 (the gas flow path 303C) are switched at a high speed, and a plurality of cycles are repeated. This makes it possible to suppress bowing of a concave portion formed in the center region of the substrate W while maintaining a shape of a concave portion formed in the edge region of the substrate W.

The embodiment and the like of the plasma processing system have been described above, but the present disclosure is not limited to the embodiment and the like, and various modifications and changes can be made without departing from the gist of the present disclosure described in the claims.

The invention claimed is:

1. A plasma processing apparatus comprising:
- a plasma processing chamber having a substrate support configured to support a substrate;
- a shower head having a plurality of gas inlets configured to introduce a gas into respective regions in the plasma processing chamber;
- a gas supply configured to supply a gas to the plurality of gas inlets;
- a plasma generator configured to generate a plasma of the gas; and
- a controller configured to control at least the gas supply,
- wherein the gas supply includes:
  - a gas unit configured to supply a common gas to the plurality of gas inlets; and
  - an injection unit configured to
- independently select and supply an injection gas to each gas inlet among the plurality of gas inlets, and
- independently adjust a flow rate of each injection gas supplied to each gas inlet,
- wherein the controller controls the injection unit so that two or more types of injection gases are supplied to at least two different ones of the plurality of gas inlets,
- wherein the gas supply further includes a gas source upstream from and connected to the gas unit and the injection unit,
- wherein the gas source includes a sub-source for each component gas of the common gas and the injection gases such that the same gases are suppliable as components of the common gas and injection gases,
- wherein the gas supply further includes a gas flow path leading from each sub-source of the gas source,
- wherein each gas flow path is branched into a gas unit flow path and an injection unit flow path,
- wherein each injection unit flow path is branched into the same number of sub-injection unit flow paths as the number of gas inlets in the plurality of gas inlets of the shower head,
- wherein each injection unit flow path includes a valve upstream from the corresponding branch of the injection unit flow path, and
- wherein each sub-injection unit flow path includes a flow rate controller.

2. The plasma processing apparatus of claim 1,
- wherein the controller
- repeats a first step and a second step to perform plasma processing on the substrate, and
- switches at least one of a gas type and a flow rate of the injection gas supplied to each gas inlet in the first step and the second step.

3. The plasma processing apparatus of claim 1,
- wherein the gas supply includes a flow splitter configured to distribute the common gas supplied from the gas unit and supply the common gas to the plurality of gas inlets, and
- the injection unit is configured to be connected to gas flow paths installed corresponding to the plurality of respective gas inlets of the shower head, which is downstream of the flow splitter, and inject the injection gas into the common gas distributed by the flow splitter.

4. The plasma processing apparatus of claim 1, wherein the controller controls the injection unit so that five or more types of injection gases are supplied to two or more different ones of the plurality of gas inlets.

5. A gas supply method for the plasma processing apparatus of claim 1, the gas supply method comprising:
- supplying the common gas to the plurality of gas inlets; and
- supplying the two or more types of injection gases to the at least two different ones of the plurality of gas inlets.

* * * * *